(12) United States Patent
Caiafa et al.

(10) Patent No.: US 7,915,944 B2
(45) Date of Patent: Mar. 29, 2011

(54) GATE DRIVE CIRCUITRY FOR NON-ISOLATED GATE SEMICONDUCTOR DEVICES

(75) Inventors: Antonio Caiafa, Niskayuna, NY (US); Jeffrey Joseph Nasadoski, Gloversville, NY (US); John Stanley Glaser, Niskayuna, NY (US); Juan Antonio Sabate, Gansevoort, NY (US); Richard Alfred Beaupre, Pittsfield, MA (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 12/495,048

(22) Filed: Jun. 30, 2009

(65) Prior Publication Data

US 2010/0271081 A1  Oct. 28, 2010

Related U.S. Application Data

(60) Provisional application No. 61/173,201, filed on Apr. 27, 2009.

(51) Int. Cl.
*H03K 17/16* (2006.01)
*H03K 17/30* (2006.01)

(52) U.S. Cl. ........ 327/379; 327/386; 327/534; 327/535; 327/537

(58) Field of Classification Search .......... 327/379–386, 327/534, 535, 537
See application file for complete search history.

(56) References Cited

U.S. PATENT DOCUMENTS

| | | | | |
|---|---|---|---|---|
| 5,532,896 | A  | * | 7/1996 | Coussens et al. ............ 361/56 |
| 5,696,396 | A  | * | 12/1997 | Tokura et al. ............ 257/341 |
| 6,392,859 | B1 | * | 5/2002 | Ohshima ............ 361/100 |
| 6,515,534 | B2 | * | 2/2003 | Dabral ............ 327/534 |
| 6,650,520 | B2 | * | 11/2003 | He ............ 361/84 |
| 6,943,611 | B2 |   | 9/2005 | Braun et al. |
| 2005/0263800 | A1 | * | 12/2005 | Kwon et al. ............ 257/287 |
| 2006/0098523 | A1 | * | 5/2006 | Takita et al. ............ 365/230.06 |
| 2006/0278925 | A1 | * | 12/2006 | Yamaguchi ............ 257/341 |
| 2008/0054984 | A1 | * | 3/2008 | Lee ............ 327/419 |
| 2008/0265980 | A1 |   | 10/2008 | Reichl et al. |
| 2009/0115253 | A1 | * | 5/2009 | Cassia et al. ............ 307/80 |

(Continued)

FOREIGN PATENT DOCUMENTS

DE 10 2005 030 831 B3 6/2006

OTHER PUBLICATIONS

Kazuaki Mino, Simon Herold and J. W. Kolar; "A Gate Drive Circuit for Silicon Carbide JFET"; CH-8092 Zurich / Switzerland /Europe; 0-7803-7906-3/03/$17.00 02003 IEEE; On pp. 1162-1166.

(Continued)

*Primary Examiner* — Lincoln Donovan
*Assistant Examiner* — Adam D Houston
(74) *Attorney, Agent, or Firm* — Scott J. Asmus

(57) ABSTRACT

One embodiment is a gate drive circuitry for switching a semiconductor device having a non-isolated input, the gate drive circuitry having a first circuitry configured to turn-on the semiconductor device by imposing a current on a gate of the semiconductor device so as to forward bias an inherent parasitic diode of the semiconductor device. There is a second circuitry configured to turn-off the semiconductor device by imposing a current on the gate of the semiconductor device so as to reverse bias the parasitic diode of the semiconductor device wherein the first circuitry and the second circuitry are coupled to the semiconductor device respectively through a first switch and a second switch.

21 Claims, 6 Drawing Sheets

U.S. PATENT DOCUMENTS

2009/0261896 A1* 10/2009 Tzu-Chien et al. ............ 327/543
2010/0088534 A1*  4/2010 Watanabe et al. ............. 713/340
2010/0127690 A1*  5/2010 Endo ............................. 323/318

OTHER PUBLICATIONS

Bjäorn Allebrand and Hans-Peter Nee; "Design of a Gate Drive Circuit for use with SiC JFETs"; http://www.ee.kth.se/php/modules/publications/reports/2002/IR-EE-EME_2002_018.pdf ; 4pages.

Domes D, Werner R, Hofmann W, Domes K and Kraub S ; "A New, Universal and Fast Switching Gate-Drive-Concept for SiC-JFETs based on Current Source Principle"; ISSN: 0275-9306; ISBN: 0-7803-9716-9 INSPEC Accession No. 9121978; Digital Object Identifier: 10.1109/PESC.2006.1712169; Current Version Published: Oct. 23, 2006; On pp. 1-6.

* cited by examiner

GATE DRIVE CIRCUITRY FOR NON-ISOLATED GATE SEMICONDUCTOR DEVICES

CROSS REFERENCE TO RELATED APPLICATIONS

This non-provisional application claims the benefit of priority under 35 U.S.C. §119(e) to U.S. Provisional Patent Application Ser. No. 61/173,201, filed Apr. 27, 2009, which is herein incorporated in its entirety by reference.

BACKGROUND

The invention relates generally to a gate drive circuitry and, more particularly, to a gate drive circuitry for improving operating performances of Si and SiC semiconductor devices.

A wide range of applications requires electronic devices that operate at higher frequency, higher power, higher temperature, and in harsh environments. For example, electronic devices and sensors employed in deep space applications, high temperature applications, radiation polluted environment applications, jet engines, airborne microwave devices require such durable and high performance devices. Devices made using wide bandgap semiconductor materials such as silicon (Si), silicon carbide (SiC), gallium nitride (GaN), and diamond exhibit these properties. Generally, semiconductors having an energy difference or energy gap between the top of the valence band and the bottom of the conduction band typically greater than two electron volts (eV) are considered wide bandgap semiconductors. Such materials are generally chemically stable at high temperatures, have good thermal conductivity, a high breakdown field and a large electron saturation velocity.

For example, silicon carbide (SiC) based semiconductor devices, for example, are increasingly being employed in a wide range of power electronics applications due to their several superior characteristics when compared to silicon (Si) based semiconductor devices. In particular, SiC based semiconductor devices have superior thermal resistance, switching or operating speed, voltage blocking capability, and on-state voltage drop that cannot all be obtained with conventional Si based semiconductor devices. Additionally, due to the wide bandgap and/or blocking capability, SiC based semiconductor devices are suitable for high voltage applications.

Such semiconductor devices, including semiconductor devices having non-isolated input such as junction gated transistors (one example includes a junction field effect transistor (JFET), a static induction transistor (SIT), a bipolar junction transistor (BJT), and a metal semiconductor field effect transistor (MESFET)), require specialized gate drive or control circuitry for proper operation. Conventional gate drive circuitry typically does not perform well when required to drive non-isolated inputs devices. For example, applying conventional gate drive circuitry, such as those available for metal oxide semiconductor field effect transistors (MOSFETs) and insulated gate bipolar transistors (IGBTs), is not optimal for non-isolated input as the devices having non-isolated input, including wide bandgap semiconductor devices, require low and controlled gate voltages.

Normally-on SiC JFET has been used in some power electronics applications, however, the maximum current that the normally-on SiC JFET can handle is limited by the gate drive. Moreover, current gate drives, and gate drives developed for normally-on SiC JFETs fail to operate adequately or are limited in operating a normally-off SiC JFET. There have been some efforts to develop a gate drive that can work with wide bandgap semiconductor devices. However, the currently available and known gate drives do not operate a normally-off SiC JFET and/or do not operate the normally-on SiC JFET above their rated power for significant periods of time.

One embodiment of the present system provides an efficient and cost-effective gate drive circuitry customized for wide bandgap semiconductor devices and/or semiconductor devices having non-isolated inputs. It is also desirable to provide a gate drive that is able to operate a normally-on SiC JFET above their rated power for significant periods of time and/or operate a normally-off SiC JFET.

BRIEF DESCRIPTION

One embodiment is a gate drive circuitry for switching a semiconductor device having a non-isolated input, the gate drive circuitry having a first circuitry configured to turn-on the semiconductor device by imposing a current on a gate of the semiconductor device so as to forward bias an inherent parasitic diode of the semiconductor device. There is a second circuitry configured to turn-off the semiconductor device by imposing a current on the gate of the semiconductor device so as to reverse bias the parasitic diode of the semiconductor device wherein the first circuitry and the second circuitry are coupled to the semiconductor device respectively through a first switch and a second switch.

Another embodiment is an electronic circuit with a semiconductor device having a non-isolated input and a gate drive circuitry for operating the semiconductor device independent of its parasitic gate-to-emitter diode characteristics by imposing one of a positive or a negative current on a gate of the semiconductor device respectively through a first switch or a second switch.

Yet another embodiment is an electronic circuit with a normally-on semiconductor device having a non-isolated input and a gate drive circuitry for operating the normally-on semiconductor device at a power greater than the rated power by imposing one of a positive or a negative current on a gate of the semiconductor device respectively through a first switch or a second switch.

A further embodiment is an electronic circuit with a normally-off semiconductor device having a non-isolated input and a gate drive circuitry for operating the normally-off semiconductor device by imposing one of a positive or a negative current on a gate of the semiconductor device respectively through a first switch or a second switch.

A method for operating a semiconductor switch device having a non-isolated input, includes switching the semiconductor device between turn-on and turn-off via one or more switches, imposing a positive current on a gate of the semiconductor device so as to turn-on the semiconductor device by forward biasing the parasitic diode of the semiconductor device, and imposing a negative current on the gate of the semiconductor device so as to turn-off the semiconductor device by reverse biasing the parasitic diode of the semiconductor device.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Embodiments of the present devices and techniques are generally directed to gate drive circuitry for a semiconductor device having a non-isolated input, including lateral, vertical, Silicon or wide bandgap material, such as a bipolar junction transistor (BJT), junction field effect transistor (JFET), vertical JFET (VJFET), static induction transistor (SIT), metal semiconductor field effect transistor (MESFET), amongst others. In certain embodiments, the semiconductor devices having the non-isolated input are wide bandgap semiconductor. The junction gated transistor may be a Schottky gated or a P-N junction gated transistor. The wide bandgap semiconductor may be silicon carbide (SiC), gallium nitride (GaN), diamond, or any other III-V compound, wide bandgap, semiconductor. Though the present discussion provides examples in context of a JFET, the application of these embodiments in other devices is well within the scope of the present invention.

Figure 1:
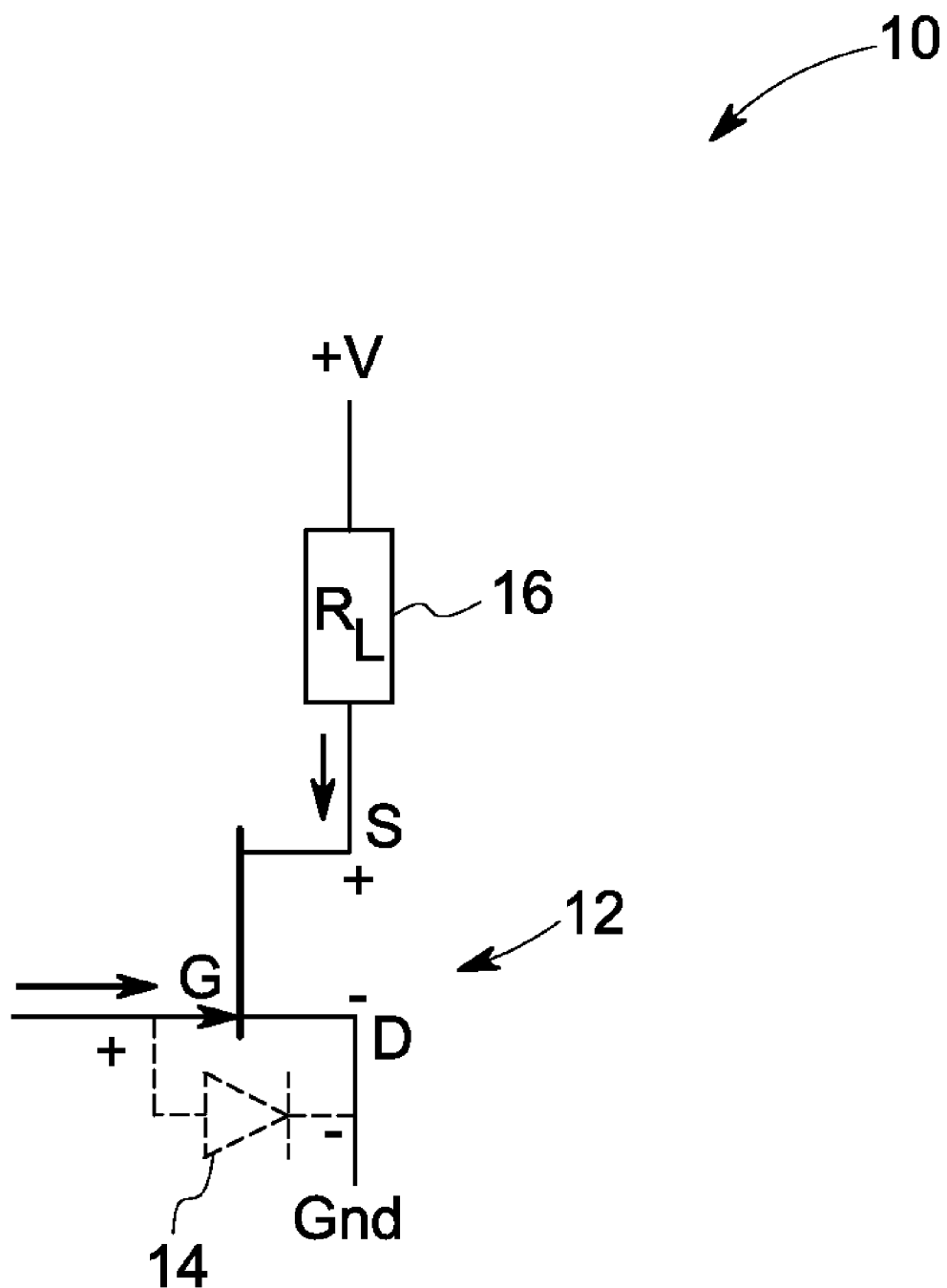
FIG. 1 depicts JFET connected to a load.

Referring now to FIG. 1, a JFET device 10 is illustrated along with the inherent parasitic characteristics. As noted herein, JFET is a semiconductor device having a non-isolated input. In the illustrated embodiment, a JFET 12 is an n-channel JFET having a drain D, a gate G, and a source S. The drain D is coupled to a voltage supply V through a resistive load $R_L$ 16. The electrical charge flows through a semiconducting channel between the source terminal S and the drain terminal D on application of bias voltage that is typically greater than a threshold voltage to the gate terminal G. The gate terminal G therefore controls the operation of the JFET 12. It should be noted that, in certain embodiments, the drain D and the source S are interchangeable. It should also be noted that the JFET 12 may be fabricated to be a normally-on JFET or a normally-off JFET.

As will be appreciated by those skilled in the art, there are inherent parasitic characteristics of the JFET that effect the performance. In this example, a parasitic diode between the gate terminal G and the source terminal S is used to model the input terminal operation of the JFET under normal operation for the inherent parasitic characteristics. In semiconductor devices, there are typically parasitic characteristics that cause the devices to perform differently than the ideal device. In some cases the parasitics are simulated so that performance has some assumed response while in other cases the limits are empirically derived. For example, the internal structure of the input of the n-channel JFET resembles a PN junction diode connected between the gate and the source terminals. If a sufficient forward or reverse bias is applied between the gate and the source terminals, the parasitic diode will cause severe malfunction.

Figure 2A:
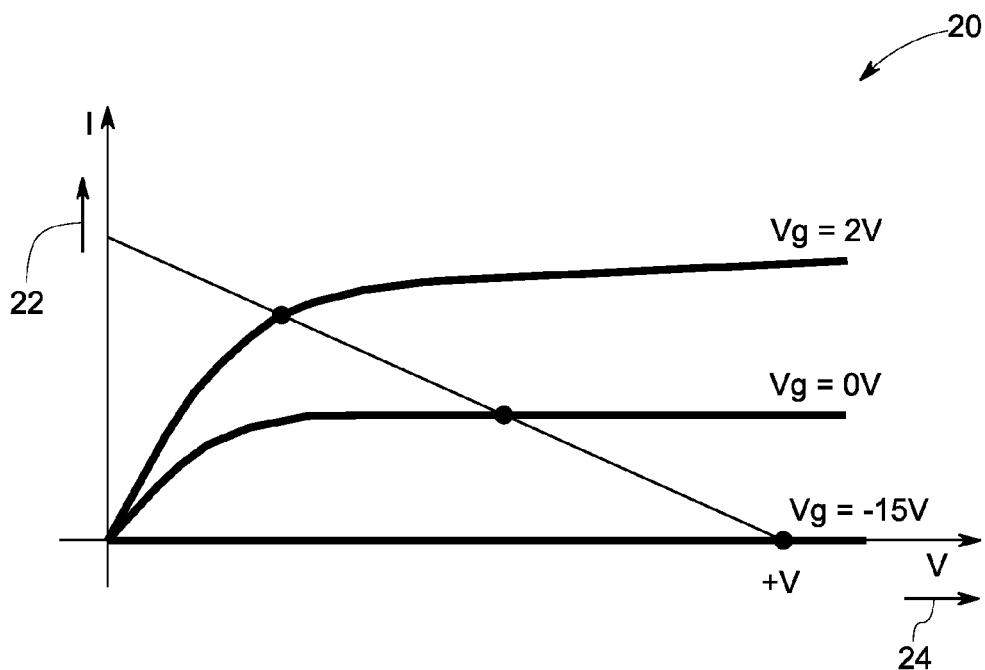
FIGS. 2A and 2B depict graphs of static current voltage characteristics of a normally-on JFET and its input intrinsic diode.
Figure 2B:
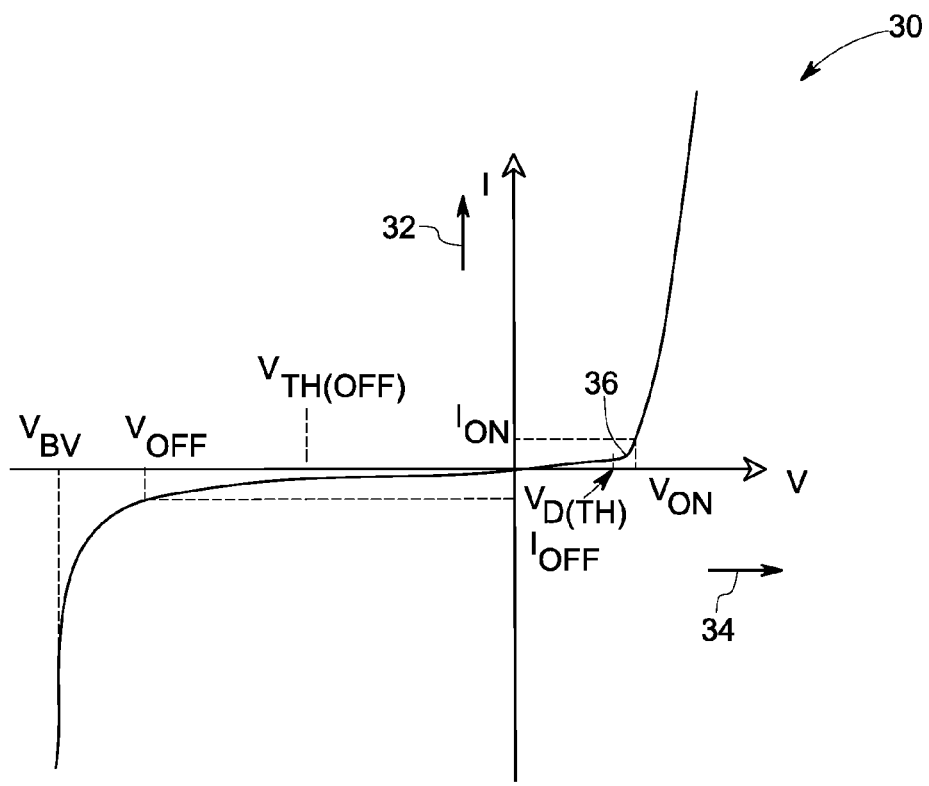

Referring now to FIG. 2A and FIG. 2B, graphs of voltage-current characteristics of a normally-on JFET and a parasitic diode structure of the normally-on JFET structure are illustrated. FIG. 2A is a graph 20 of drain-source voltage-current characteristics of the normally-on JFET (such as the JFET 12, see FIG. 1) superimposed on the V-I characteristic of a resistor (such as the resistor $R_L$ 16, see FIG. 1) connected in series with a voltage supply (such as the voltage supply V, see FIG. 1). In FIG. 2A, reference numeral 22 is representative of current I, while reference numeral 24 is representative of voltage V for several gate voltages $V_g$.

As illustrated, the normally-on JFET conducts when the applied gate voltage $V_g$ is above a threshold voltage $V_{TH(OFF)}$ of the JFET. It may be noted that $V_{TH(OFF)}$ is representative of a threshold voltage of the JFET. As will be appreciated, if the voltage developed at the gate is less than the threshold value $V_{TH(OFF)}$, then the JFET device is operating in an OFF mode. However, if the value of the voltage developed at the gate is greater than the threshold voltage $V_{TH(OFF)}$, then JFET device is operating in an ON mode. If this gate level is negative, the JFET is normally on. Furthermore, if the voltage developed at the gate is positive, then the JFET is operating in a normally off mode. The greater the voltage applied at the gate, the higher is the current through the device. The normally-on JFET stops conducting when the applied gate voltage $V_g$ is below the threshold voltage $V_{TH(OFF)}$ of the JFET.

FIG. 2B illustrates a graph 30 of voltage-current characteristics of the gated parasitic diode structure of the normally-on JFET. In FIG. 2B, reference numeral 32 is representative of current I, while reference numeral 34 is representative of voltage V. Reference numeral 36 is representative of a region on the voltage-current characteristics corresponding to a threshold voltage $V_{D(TH)}$ for the parasitic diode structure. The voltage $V_{D(TH)}$ is representative of a threshold voltage of the parasitic diode.

Also, $V_{ON}$ and corresponding current $I_{ON}$ are the voltage and current of the parasitic diode structure during forward bias when the parasitic diode structure is operating at a boundary voltage level to ensure conduction. More specifically, $I_{ON}$ is representative of a current imposed when it is desirable to operate the JFET in an ON mode, while $V_{ON}$ is representative of a voltage developed by the parasitic diode when it is desirable to operate the JFET in an ON mode.

The threshold voltage of the JFET is represented by $V_{TH(OFF)}$. $V_{BV}$ is the breakdown voltage of the parasitic diode structure and when this voltage is applied to the gate, the gate voltage is definitely lower than the off threshold voltage of the JFET. In other words, $V_{BV}$ is representative of the breakdown voltage of the parasitic diode. $V_{OFF}$ is representative of a voltage applied to the gate when it is desirable to turn the device off. In one example, $V_{OFF}$ is substantially equal to the breakdown voltage of the parasitic diode. It may be noted that $I_{OFF}$ is representative of a current imposed when it is desirable to operate the JFET in an OFF mode, while $V_{OFF}$ is representative of a voltage developed by the parasitic diode when it is desirable to operate the JFET in an ON mode.

In accordance with aspects of the present technique, it may be desirable to operate the device in a range from about 5% to about 10% or slightly above $V_{D(TH)}$, defining the region 36 that is representative of the $V_{ON}$ for the parasitic diode structure to facilitate an optimal performance of the device. By operating the device in a region slightly above the threshold voltage $V_{D(TH)}$ for the parasitic diode structure, noise levels in the device may be substantially reduced.

Figure 3A:
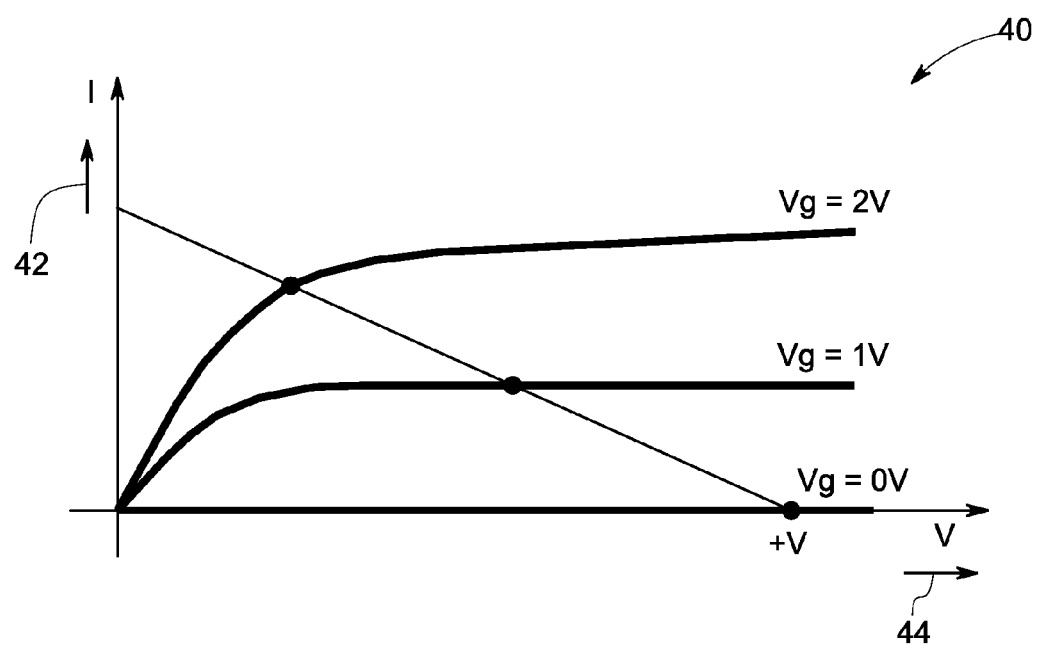
FIGS. 3A and 3B depict graphs of current voltage characteristics of a normally-off JFET and its input intrinsic diode.
Figure 3B:
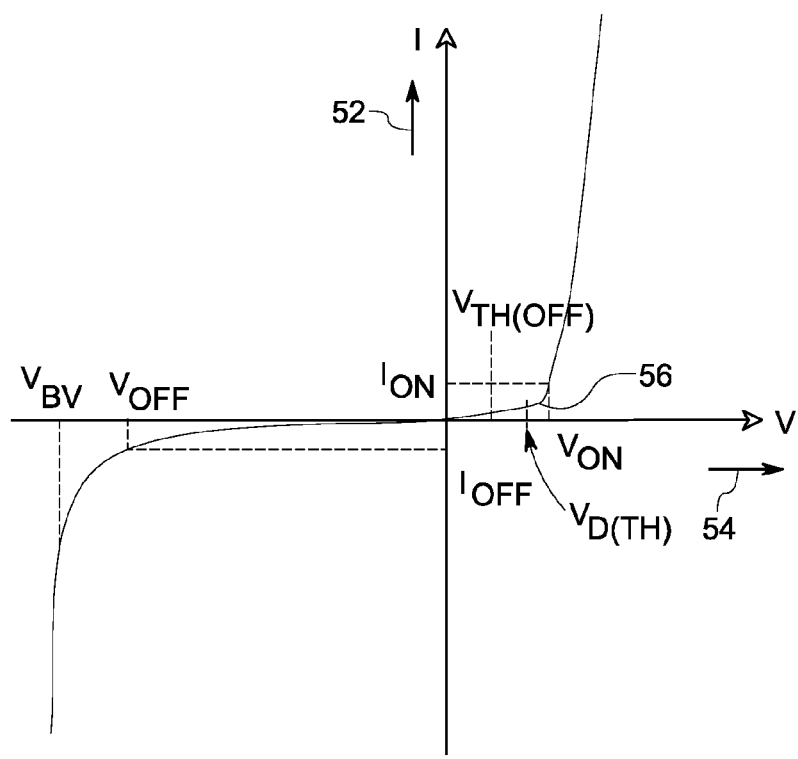

FIGS. 3A and 3B similarly illustrate graphs of the voltage-current characteristics of a normally-off JFET and a parasitic diode structure of the normally-off JFET respectively. FIG. 3A illustrates a graph 40 of drain-source voltage-current characteristics of the normally-off JFET. In FIG. 3A, reference numeral 42 is representative of current I, while reference numeral 44 is representative of voltage V. Also, FIG. 3B illustrates a graph 50 of voltage-current characteristics of the parasitic diode structure of the normally-off JFET. In FIG.

3B, reference numeral 52 is representative of current I, while reference numeral 54 is representative of voltage V. Reference numeral 56 is representative of a region on the voltage-current characteristics corresponding to a threshold voltage $V_{D(TH)}$ for the parasitic diode structure. As will be appreciated by those skilled in the art, the characteristics of the normally-off JFET are similar to the characteristics of a normally-on JFET except that in the normally-off case only a positive gate voltage is able to turn-on the JFET device, and zero gate voltage will suffice in turning the device off. The threshold voltage of the JFET is represented by $V_{TH(OFF)}$. Here again, $V_{ON}$ and corresponding current $I_{ON}$ are the voltage and current of the parasitic diode structure during forward bias when the parasitic diode structure is operating at a boundary voltage level to ensure conduction. Also, $V_{OFF}$ and corresponding current $I_{OFF}$ are the voltage and current of the parasitic diode structure used to operate the device in the normally-off mode. It may be noted that in certain applications it is desirable to control and maintain the on-voltage $V_{ON}$ at a value below or equal to the on-voltage $V_{D(TH)}$ of the parasitic diode.

Figure 4:
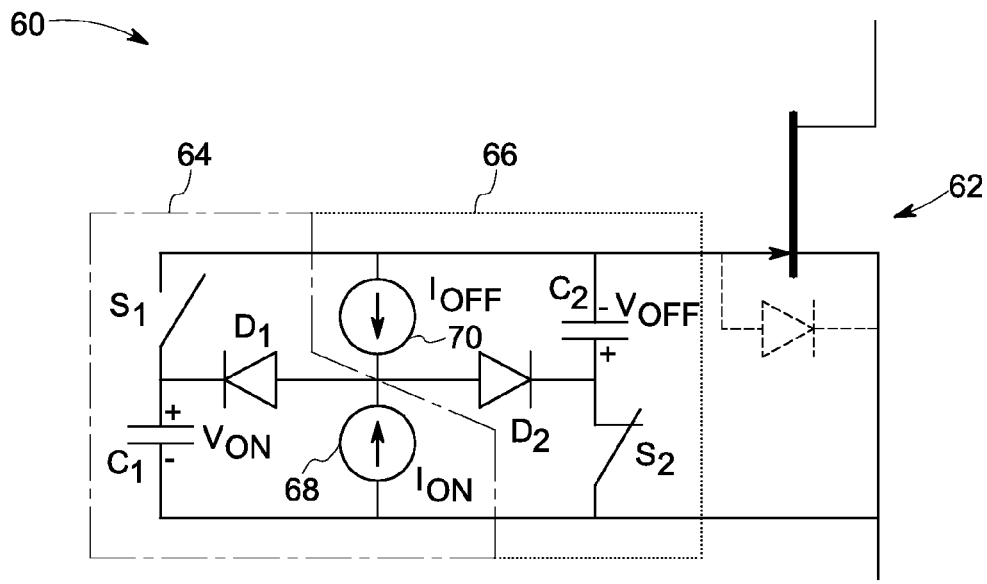
FIG. 4 depicts a schematic of a gate drive circuitry for switching a semiconductor device having a non-isolated input.

Turning now to FIG. 4, a schematic 60 of a gate drive circuitry for switching a semiconductor device 62 having a non-isolated input is illustrated. In the illustrated embodiment, the semiconductor device 62 is a JFET device. The gate drive circuitry includes a first circuitry 64 and a second circuitry 66 coupled to the semiconductor device 62 respectively through a first switch $S_1$ and a second switch $S_2$. The second switch $S_2$ is normally closed (i.e., normally on) while the first switch $S_1$ is normally open (i.e., normally off). Based on the operation, the switches $S_1$, $S_2$ are then closed or opened in a mutually exclusive fashion. Further, it should be noted that the first switch $S_1$ and the second switch $S_2$ may be any electronically controlled semiconductor device such as MOSFET, JFET, and so forth.

The first circuitry 64 is configured to turn-on the semiconductor device 62 by imposing a current on a gate of the semiconductor device 62 so as to forward bias the parasitic diode of the semiconductor device 62. Similarly, the second circuitry 66 is configured to turn-off the semiconductor device 62 by imposing a current on the gate of the semiconductor device 62 so as to reverse bias the parasitic diode of the semiconductor device 62. In other words, the first circuitry 64 imposes a positive turn-on current while the second circuitry 66 imposes a negative turn-off current at the gate of the semiconductor device 62. As will be appreciated by those skilled in the art, the first circuitry 64 and the second circuitry 66 impose current on the gate of the semiconductor device 62 for as long as the respective first switch $S_1$ and the second switch $S_2$ are closed.

Each of the first circuitry 64 and the second circuitry 66 includes a current source coupled to a capacitor through a diode. For example, the first circuitry 64 may include a current source $I_{ON}$ 68 coupled to the capacitor $C_1$ through diode $D_1$. Similarly, the second circuitry 66 may include a current source $I_{OFF}$ 70 coupled to the capacitor $C_2$ through diode $D_2$. The first circuitry 64 charges the capacitor $C_1$ to a voltage $V_{ON}$ greater than a threshold voltage of the JFET. It may be desirable that the voltage $V_{ON}$ does not exceed the gate voltage limit of the semiconductor device 62 imposed by the parasitic diode. It should be noted that the voltage $V_{ON}$ will be slightly above the threshold voltage $V_{D(TH)}$ of the parasitic diode. In one embodiment, it may be desirable that the voltage $V_{ON}$ be in a range that is about 5% to 10% above the threshold voltage $V_{D(TH)}$ of the parasitic diode. Similarly, the second circuitry 66 charges the capacitor $C_2$ to a voltage $V_{OFF}$ that is lower than the threshold voltage $V_{TH(OFF)}$ of the semiconductor device 62 and higher (or lower absolute value) than a breakdown voltage $V_{BV}$ of the parasitic diode. Here again, in one embodiment, it may be desirable that the voltage $V_{OFF}$ be in range that is about 5% to 10% lower than the threshold voltage $V_{TH(OFF)}$ of the parasitic diode. In addition, in one embodiment, it may be desirable that the voltage $V_{OFF}$ be in a range that is about 5% to 10% (of $V_{BV}$) higher than the breakdown voltage $V_{BV}$ of the parasitic diode. The $V_{ON}$ and VOFF voltages correspond to the parasitic diode characteristics to control the device to operate in the ON or OFF modes, respectively. Additionally, the values of $I_{ON}$ and $I_{OFF}$ are limited by the circuit implementations presented herein to ensure operation of the device in the ON or OFF modes without undesirable or excessive currents.

In certain embodiments, the current sources $I_{ON}$ and $I_{OFF}$ are operated at an ambient temperature while the diodes $D_1$ and $D_2$ and the capacitors $C_1$ and $C_2$ are placed in close proximity to the semiconductor device 62 and are operated at an operating temperature of the semiconductor device 62. Such placement enables high-speed operation of the gate drive and the corresponding semiconductor device in harsh environments.

Figure 5:
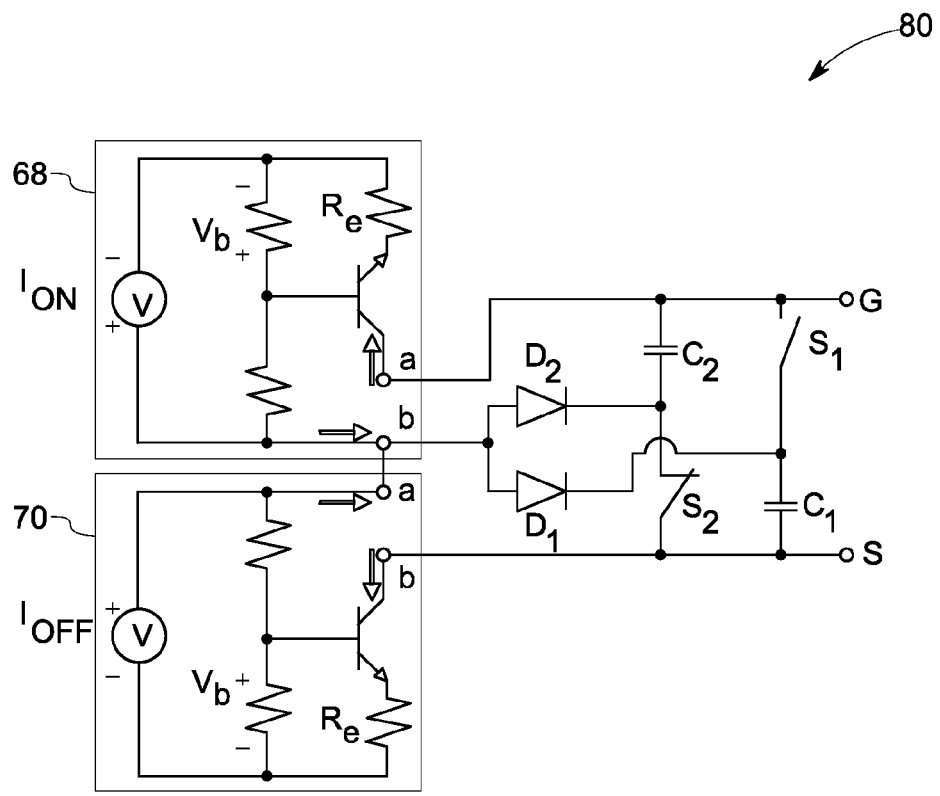
FIGS. 5-7 depict circuit diagrams of the gate drive circuitry of FIG. 4 in greater detail, in accordance with aspects of the present technique.
Figure 6:
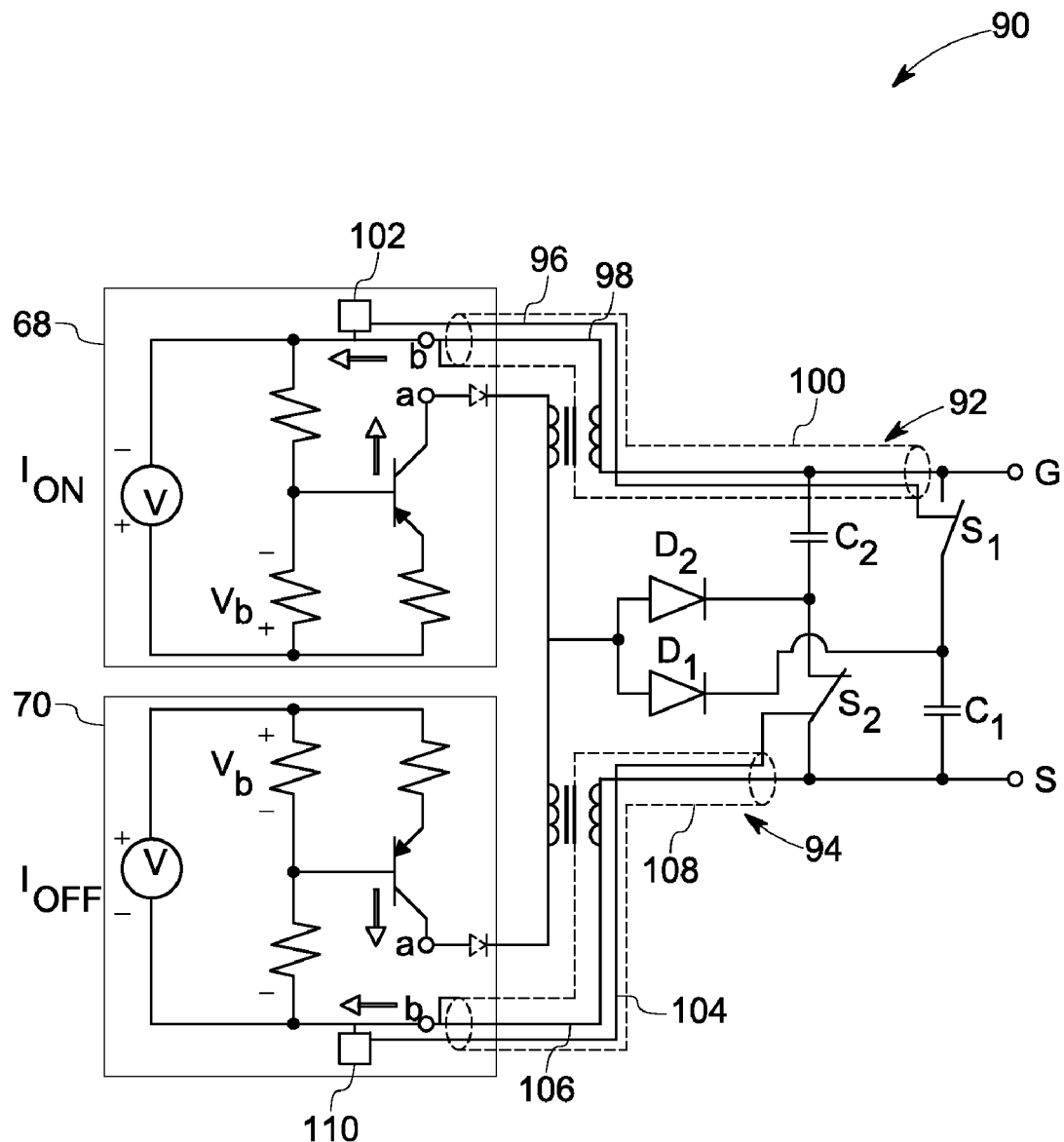
Figure 7:
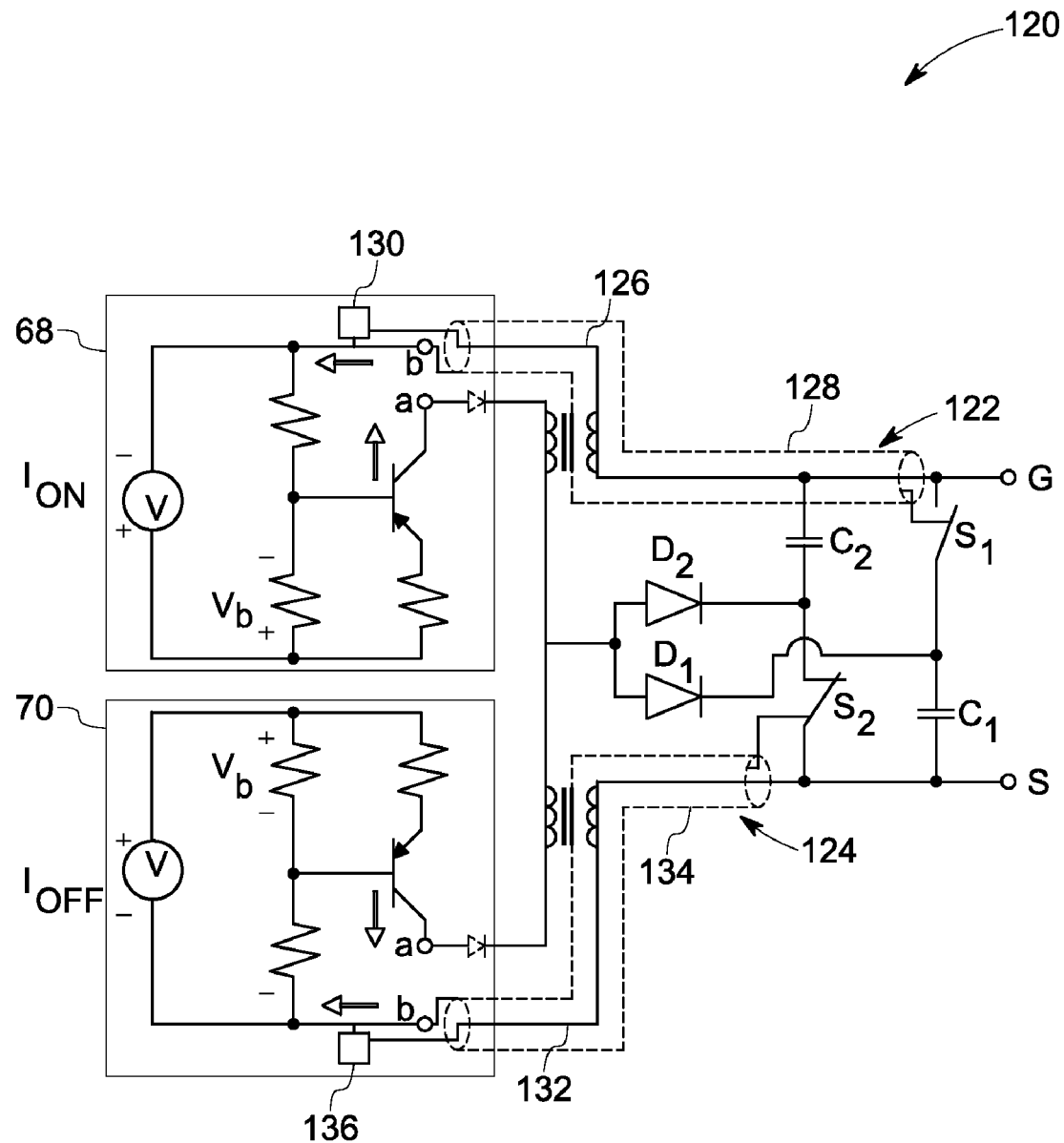

FIGS. 5-7 depict circuit diagrams 80, 90, 120 of the gate drive circuitry in greater detail in accordance with aspects of the present technique. More particularly, FIG. 5 is a diagrammatic illustration of one embodiment 80 of the gate drive circuitry 60 of FIG. 4. Also, FIG. 6 is a diagrammatic illustration of another embodiment 90 of the gate drive circuitry 60 of FIG. 4. FIG. 7 is a diagrammatic illustration of yet another embodiment 120 of the gate drive circuitry 60 of FIG. 4.

Switches $S_1$ and $S_2$ may be configured to receive a control logic signal from a control circuitry (not shown in FIG. 5), for example. In certain embodiments, the control circuitry may include a microprocessor, a FPGA, and the like. The control signal may be configured to control the opening and closing of the switches $S_1$ and S2. More particularly, the control signal may be configured to close the second switch $S_2$ when the first switch $S_1$ is open. In a similar fashion, the control signal may also be configured to open the second switch $S_2$ when the first switch $S_1$ is closed.

As illustrated in FIGS. 5-7, the current sources $I_{ON}$ 68 and $I_{OFF}$ 70 are shown in greater detail. Furthermore, as illustrated in FIGS. 5-7, each of the current sources $I_{ON}$ 68 and $I_{OFF}$ 70 includes a source, plurality of resistors, and a semiconductor device configured so as to provide imposing currents and voltage to the gate of the semiconductor device having a non-isolated input. As will be appreciated by those skilled in the art, other possible current sources may also be employed by the gate circuitry 80, 90, 120. Further, it should be noted that the gate drive circuitry 80, 90, 120 may include additional control circuitry (not shown).

Referring now to FIGS. 6-7, in accordance with exemplary aspects of the present technique, the embodiments of the gate drive circuitry 90, 120 are shown as including isolated signal control transmission for operating the first and the second switches $S_1$, $S_2$ that regulate the first and the second circuitry 64, 66 (see FIG. 4). In FIG. 6, the isolated signal control transmission includes a first coaxial cable 92 and a second coaxial cable 94. The first coaxial cable 92 may be configured to operate the first switch $S_1$, while the second coaxial cable 94 may be controlled to operate the first switch $S_2$. In a presently contemplated configuration of FIG. 6, the first and second coaxial cables 92, 94 may include a two wire shielded cable or dual wire cables.

The first coaxial cable 92 includes a first wire 96 and a second wire 98. Reference numeral 100 may be representative of a shield of the first coaxial cable 92. In a presently contemplated configuration, the first wire 96 in the first coaxial cable 92 is operationally coupled to an isolated point of contact 102, while the second wire 98 is coupled to a reference voltage b. It may be noted that the shield 100 may also be coupled to the reference voltage b. Moreover, the isolated point of contact 102 may be configured to provide an isolated signal to control the switching of the first switch $S_1$ between an open state and a closed state. This isolated signal is a clean, less noisy signal, thereby facilitating enhanced switching of the first switch $S_1$. Additionally, the second wire 98 may be operationally coupled to the gate G of the device. The capacitor $C_2$ may also be operationally coupled to second wire 98 of the first coaxial cable 92.

Similarly, the second coaxial cable 94 includes a first wire 104 and a second wire 106. Reference numeral 108 may be representative of a shield of the first coaxial cable 94. The first wire 104 in the second coaxial cable 94 is operationally coupled to an isolated point of contact 110, while the second wire 106 may be coupled to a reference voltage b. The shield 108 may also be coupled to the reference voltage b. Moreover, the isolated point of contact 110 may be configured to provide an isolated signal to control the switching of the second switch $S_2$ between an open state and a closed state. This isolated signal is a clean, less noisy signal, thereby facilitating enhanced switching of the second switch $S_2$. It may be noted that the second wire 106 of the second coaxial cable 94 may be operationally coupled to the source S of the device. The capacitor $C_1$ may also be operationally coupled to the second wire 106 of the second coaxial cable 94.

With continuing reference to FIG. 6, the gate drive circuitry may also include other components configured to reduce electromagnetic interference. In one embodiment, such components may include an inductor and a diode coupled to current sources 68, 70 and the coaxial cables 92, 94.

Turning now to FIG. 7, yet another embodiment of the gate drive circuitry 120 is presented, where the gate drive circuitry is shown as including isolated signal control transmission for operating the first and the second switches $S_1$, $S_2$ that regulate the first and the second circuitry 64, 66 (see FIG. 4). The isolated signal control transmission includes a first cable 122 and a second cable 124. The first cable 122 is configured to operate the first switch $S_1$, while the second coaxial cable 124 is controlled to operate the second switch $S_2$. In a presently contemplated configuration, the first and second cables 122, 124 may include single wire shielded cables.

Furthermore, the first cable 122 includes a wire 126 and a shield 128. In a presently contemplated configuration, the wire 126 in the first cable 122 is operationally coupled to an isolated point of contact 130, while the shield 128 may be coupled to a reference voltage b. This isolated point of contact 130 is configured to provide an isolated signal to control the switching of the first switch $S_1$ between an open state and a closed state. This isolated signal is a clean, less noisy signal, thereby facilitating enhanced switching of the first switch $S_1$. Additionally, the shield 128 may be operationally coupled to the gate G of the device. The capacitor $C_2$ may also be operationally coupled to the shield 128 of the first cable 122.

Similarly, the second cable 124 includes a wire 132 and a shield 134. The wire 132 in the second cable 124 is operationally coupled to an isolated point of contact 136, while the shield 134 may be coupled to a reference voltage b. Additionally, the point of contact 136 may be configured to provide an isolated signal to control the switching of the second switch $S_2$ between an open state and a closed state. This isolated signal is a clean, noiseless signal, thereby facilitating enhanced switching of the second switch $S_2$. It may be noted that the shield 134 may be operationally coupled to the source S of the device. The capacitor $C_2$ may also be operationally coupled to the shield 128 of the first cable 122. As previously noted with reference to FIG. 6, the gate drive circuitry of FIG. 7 may also include other components configured to reduce electromagnetic interference. In one embodiment, such components may include an inductor and a diode coupled to current sources 68, 70 and the single wire cables 122, 124.

As will be appreciated by those skilled in the art, the gate drive circuitry, described in the various embodiments discussed above, enables operation of the normally-on semiconductor device at a power greater than the rated power. Additionally, the exemplary gate drive circuitry enables operation of the normally-off semiconductor device. Moreover, it should be noted that the gate drive circuitry is adapted to operate the semiconductor device independent of its parasitic gate-to-emitter diode characteristics. The gate drive circuitry automatically determines an optimal operating state for the semiconductor device independent of a specification of the semiconductor device. The gate drive circuitry ensures that an on-voltage of the semiconductor device is slightly greater that the threshold voltage $V_{D(TH)}$ of the parasitic diode and an off-voltage of the semiconductor device is slightly greater (or less in absolute value) than the breakdown voltage $V_{BV}$ of the parasitic diode.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A gate drive circuitry for switching a semiconductor device having a non-isolated input, the gate drive circuitry comprising:
    a first circuitry configured to turn-on the semiconductor device by imposing a current on a gate of the semiconductor device to forward bias an inherent parasitic diode of the semiconductor device; and
    a second circuitry configured to turn-off the semiconductor device by imposing a current on the gate of the semiconductor device to reverse bias the parasitic diode of the semiconductor device,
    wherein the first circuitry and the second circuitry are coupled to the semiconductor device respectively through a first switch and a second switch, and wherein each of the first circuitry and the second circuitry comprises a current source coupled to a capacitor through a diode.

2. The gate drive circuitry of claim 1, wherein each of the first circuitry and the second circuitry imposes a current on the gate of the semiconductor device for as long as the respective first switch and the respective second switch are closed.

3. The gate drive circuitry of claim 1, wherein the second switch is normally closed while the first switch is normally open.

4. The gate drive circuitry of claim 1, wherein the first circuitry charges the capacitor to a voltage $V_{ON}$ greater than a threshold voltage $V_{TH}$ of the parasitic diode such that the voltage $V_{ON}$ does not exceed a gate voltage limit of the semiconductor device.

5. The gate drive circuitry of claim 1, wherein the second circuitry charges the capacitor to a voltage $V_{OFF}$ lower than a threshold voltage $V_{TH(OFF)}$ of the semiconductor device and higher than a breakdown voltage $V_{BV}$ of the parasitic diode.

6. The gate drive circuitry of claim 1, wherein the current sources are operated at an ambient temperature while the diodes and the capacitors are placed in close proximity to the semiconductor device and are operated at an operating temperature of the semiconductor device.

7. The gate drive circuitry of claim 1, wherein the gate drive circuitry is adapted to operate the semiconductor device independent of its parasitic gate-to-emitter diode characteristics.

8. The gate drive circuitry of claim 1, wherein the gate drive circuitry automatically determines an optimal operating state for the semiconductor device independent of a specification of the semiconductor device.

9. The gate drive circuitry of claim 8, wherein an on-voltage of the semiconductor device is slightly greater than the threshold voltage $V_{D(TH)}$ of the parasitic diode and an off-voltage of the semiconductor device is slightly greater than the breakdown voltage $V_{BV}$ of the parasitic diode or less than the breakdown voltage $V_{BV}$ of the parasitic diode if absolute value is considered.

10. The gate drive circuitry of claim 9, wherein the on-voltage of the semiconductor device is in the range of 5% to 10% greater than the threshold voltage $V_{D(TH)}$ of the parasitic diode and the off-voltage of the semiconductor device is in the range of 5% to 10% greater than the breakdown voltage $V_{BV}$ of the parasitic diode.

11. The gate drive circuitry of claim 1, wherein the semiconductor device is a normally-on semiconductor device, and wherein the gate drive circuitry is adapted to operate the normally-on semiconductor device at a power greater than the rated power.

12. The gate drive circuitry of claim 1, wherein the semiconductor device is a normally-off semiconductor device, and wherein the gate drive circuitry is adapted to operate the normally-off semiconductor device.

13. The gate drive circuitry of claim 1, wherein the semiconductor device having the non-isolated input comprises a wide bandgap semiconductor junction gated transistor.

14. The gate drive circuitry of claim 13, wherein the wide bandgap semiconductor junction gated transistor comprises a Schottky gated transistor or a PN junction gated transistor.

15. The gate drive circuitry of claim 13, wherein the wide bandgap semiconductor comprises silicon carbide, gallium nitride, or diamond.

16. The gate drive circuitry of claim 1, wherein the semiconductor device having the non-isolated input comprises a bipolar junction transistor (BJT), a junction field effect transistor (JFET), a vertical JFET (VJFET), a static induction transistor (SIT), or a metal semiconductor field effect transistor (MESFET).

17. The gate drive circuitry of claim 1, wherein each of the first switch and the second switch comprises an electronically controlled semiconductor device.

18. An electronic circuit, comprising:
a semiconductor device having a non-isolated input; and
a gate drive circuitry for operating the semiconductor device independent of its parasitic gate-to-emitter diode characteristics by imposing one of a positive or a negative current on a gate of the semiconductor device respectively through a first switch or a second switch, wherein the gate drive circuitry comprises a first circuitry and a second circuitry, wherein the first circuitry and the second circuitry are coupled to the semiconductor device respectively through the first switch and the second switch, and wherein each of the first circuitry and the second circuitry comprises a current source coupled to a capacitor through a diode.

19. An electronic circuit, comprising:
a normally-on semiconductor device having a non-isolated input; and
a gate drive circuitry for operating the normally-on semiconductor device at a power greater than the rated power by imposing one of a positive or a negative current on a gate of the semiconductor device respectively through a first switch or a second switch, wherein the gate drive circuitry comprises a first circuitry and a second circuitry, wherein the first circuitry and the second circuitry are coupled to the normally-on semiconductor device respectively through the first switch and the second switch, and wherein each of the first circuitry and the second circuitry comprises a current source coupled to a capacitor through a diode.

20. An electronic circuit, comprising:
a normally-off semiconductor device having a non-isolated input; and
a gate drive circuitry for operating the normally-off semiconductor device by imposing one of a positive or a negative current on a gate of the semiconductor device respectively through a first switch or a second switch, wherein the gate drive circuitry comprises a first circuitry and a second circuitry, wherein the first circuitry and the second circuitry are coupled to the normally-off semiconductor device respectively through the first switch and the second switch, and wherein each of the first circuitry and the second circuitry comprises a current source coupled to a capacitor through a diode.

21. A method for operating a semiconductor switch device having a non-isolated input, the method comprising:
switching the semiconductor device between turn-on and turn-off via one or more switches;
imposing a positive current on a gate of the semiconductor device to turn-on the semiconductor device by forward biasing a parasitic diode of the semiconductor device using a first circuitry in a gate drive circuitry; and
imposing a negative current on the gate of the semiconductor device to turn-off the semiconductor device by reverse biasing the parasitic diode of the semiconductor device using a second circuitry in the gate drive circuitry,
wherein the first circuitry and the second circuitry are coupled to the semiconductor switch device through the one or more switches, and wherein each of the first circuitry and the second circuitry comprises a current source coupled to a capacitor through a diode.

* * * * *